(12) United States Patent
Nagayama et al.

(10) Patent No.: US 8,344,781 B2
(45) Date of Patent: Jan. 1, 2013

(54) POWER AMPLIFICATION DEVICE, AND TRANSMISSION DEVICE AND COMMUNICATION DEVICE USING SAME

(75) Inventors: Akira Nagayama, Tokyo (JP); Yasuhiko Fukuoka, Tokyo (JP); Kouichi Maruta, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 150 days.

(21) Appl. No.: 13/057,471

(22) PCT Filed: Jul. 31, 2009

(86) PCT No.: PCT/JP2009/063703
§ 371 (c)(1),
(2), (4) Date: Feb. 3, 2011

(87) PCT Pub. No.: WO2010/016444
PCT Pub. Date: Feb. 11, 2010

(65) Prior Publication Data
US 2011/0140761 A1    Jun. 16, 2011

(30) Foreign Application Priority Data

Aug. 7, 2008  (JP) ................................. 2008/203834
Oct. 29, 2008  (JP) ................................. 2008-278113

(51) Int. Cl.
*H03H 11/16*  (2006.01)
(52) U.S. Cl. .......................... 327/238; 327/237; 327/231
(58) Field of Classification Search .................. 327/355, 327/361, 231, 233, 237, 238, 248
See application file for complete search history.

(56) References Cited

U.S. PATENT DOCUMENTS

| | | | |
|---|---|---|---|
| 7,667,523 B2 * | 2/2010 | Oishi et al. | 327/359 |
| 7,671,635 B2 * | 3/2010 | Fan et al. | 327/105 |
| 8,013,652 B2 * | 9/2011 | Nagayama | 327/231 |
| 8,207,774 B2 * | 6/2012 | Nagayama | 327/231 |

(Continued)

FOREIGN PATENT DOCUMENTS

EP          0 635 934          1/1995

(Continued)

OTHER PUBLICATIONS

International Preliminary Report on Patentability for PCT/JP2009/063703, mailed on Mar. 17, 2011, 6 pages.

(Continued)

*Primary Examiner* — Hai L Nguyen
(74) *Attorney, Agent, or Firm* — Duane Morris LLP

(57) ABSTRACT

To provide a power amplification device that can amplify an input signal having an envelope variation with high power-added efficiency in a wide frequency range, and a transmission device and a communication device using the power amplification device. A first orthogonal signal (Sd1) is generated by performing vector subtraction between first and second fundamental signals (Su1 and Su2) having the same amplitude and a phase difference $\delta\theta$ (0 degrees<$\delta\theta$<180 degrees) therebetween. First and second fundamental signals are generated based on an input signal (Sin). A second orthogonal signal (Sd2) is generated by performing vector addition between the first and second fundamental signals (Su1 and Su2). First and second constant envelope signals (S1 and S2) are generated by performing vector addition between the second fundamental signal (Su2) and first and second constant envelope vector generation signals (e and -e) obtained based on the first fundamental signal (Su1). An output signal (Sout) obtained by amplifying the input signal (Sin) is output based on the first and second constant envelope signals (S1 and S2).

8 Claims, 7 Drawing Sheets

U.S. PATENT DOCUMENTS

2007/0092021 A1  4/2007  Otaka et al.

FOREIGN PATENT DOCUMENTS

| JP | 01-284106 | 11/1989 |
| JP | 02-054607 | 2/1990 |
| JP | 05-037263 | 2/1993 |
| JP | 06-022302 | 3/1994 |
| JP | 2003-152464 | 5/2003 |
| JP | 2004-343665 | 12/2004 |
| JP | 2006-339888 | 12/2006 |
| JP | 2007-104007 | 4/2007 |

OTHER PUBLICATIONS

International Search Report for PCT/JP2009/063703, mailed on Sep. 29, 2009, 2 pages.

Shi et al., "A 200-MHz IF BiCMOS Signal Component Separator for Linear LINC Transmitters," IEEE Journal of Solid-State Circuits (2000) 35(7):987-993; Jul. 2000.

Shi et al., "A 200MHz IF BiCMOS chip for linear LINC transmitters," Solid-State Circuits Conference (1999) pp. 282-285.

Supplementary European Search Report for EP 09804928.1, mailed Mar. 14, 2012, 5 pages.

* cited by examiner

POWER AMPLIFICATION DEVICE, AND TRANSMISSION DEVICE AND COMMUNICATION DEVICE USING SAME

CROSS-REFERENCE TO RELATED APPLICATIONS

This is a U.S. National Phase Application of International Application No. PCT/JP2009/063703 filed Jul. 31, 2009, which claims priority to Japanese Patent Application No. 2008-203834 filed Aug. 7, 2008 and Japanese Patent Application No. 2008-278113 filed Oct. 29, 2008, the disclosures of which are incorporated herein by reference in their entirety.

TECHNICAL FIELD

The present invention relates to a power amplification device, and a transmission device and a communication device using the power amplification device. In particular, the present invention relates to a power amplification device that converts an input signal into two constant envelope signals and performs vector addition of the two amplified constant envelope signals after amplifying the two constant envelope signals, and to a transmission device and a communication device using the power amplification device.

BACKGROUND ART

A LINC (Linear amplification with Nonlinear Components) method is known as a power amplification method used for amplifying, for example, a transmit signal in a communication device. In the LINC method, after an input signal having an envelope variation has been converted into two constant envelope signals having a phase difference corresponding to the amplitude of the input signal, each of the two constant envelope signals is amplified by using a nonlinear amplifier. Then, vector addition of the two amplified constant envelope signals is performed to obtain an amplified input signal. According to this method, because the nonlinear amplifier has only to amplify the constant envelope signals, a power-added efficiency may be improved (for example, refer to Patent Document 1).

PRIOR ART DOCUMENT

Patent Document

Patent Document 1: JP 06-22302 B

DISCLOSURE OF THE INVENTION

Problems to be Solved by the Invention

However, in a power amplifier circuit disclosed in the above Patent document 1, because the input signal is converted into two constant envelope signals through digital signal processing, an analog/digital converter, a digital/analog converter and the like are required. As a result, there has been a problem that the circuit scale is increased.

Therefore, the applicant of this application is studying a circuit structure for converting an input signal to two constant envelope signals by analog signal processing. The circuit structure is illustrated in FIG. 9. In this novel power amplification device 500, a phase shifter 502 advances a phase of an input signal Sin by 90 degrees to obtain an orthogonal signal. Then, a signal (first constant envelope vector generation signal e), which is obtained by amplifying the orthogonal signal in a variable gain amplifier 504, is generated. Then, vector addition between this first constant envelope vector generation signal e and the input signal Sin is performed in an adder circuit 506 to generate a first constant envelope signal S1. In addition, a reversed phase signal (second constant envelope vector generation signal −e), which is obtained by delaying the phase of the first constant envelope vector generation signal e by 180 degrees in the phase shifter 510, is generated. Then, vector addition of this second constant envelope vector generation signal −e and the input signal Sin is performed in an adder circuit 508 to generate a second constant envelope signal S2. Then, amplitudes (specifically, squared amplitudes) of the first constant envelope signal S1 and the second constant envelope signal S2 are detected by mixers (amplitude detection circuits) 516 and 518, and a signal indicating a sum value of the amplitudes is generated by an adder circuit 520. In addition, a signal indicating a difference between the sum value and a predetermined voltage Vref is generated by an adder circuit 514. Further, an output from the adder circuit 514 is input to a low pass filter 512, and an output from the low pass filter 512 is input via a buffer amplifier (not shown) as a gain control signal for the variable gain amplifier 504. According to this structure, a gain of the variable gain amplifier 504 is feedback controlled so that the sum of the squared amplitudes of the first constant envelope signal S1 and the second constant envelope signal S2 becomes a constant value. Thus, amplitudes of the first constant envelope signal S1 and the second constant envelope signal S2 are converged to be desired values. In this way, each of the first constant envelope signal S1 and the second constant envelope signal S2 can be a constant envelope signal. Further, the first constant envelope signal S1 and the second constant envelope signal S2 are amplified by amplifiers 531 and 532, respectively, to obtain a first amplified signal Sa1 and a second amplified signal Sa2. Then, the first amplified signal Sa1 and the second amplified signal Sa2 are added by using a vector addition circuit 541, to obtain an output signal Sout having an amplified envelope variation (see FIG. 10).

However, in this structure, in order to generate the first constant envelope vector generation signal e and the second constant envelope vector generation signal −e that are orthogonal to the input signal Sin, the phase shifter 502 for shifting the phase by 90 degrees is necessary. However, a usual phase shifter such as a ¼ wavelength line gives a particular phase shift amount to a particular frequency signal. Therefore, it is difficult to realize a phase shifter that shifts a phase by precisely 90 degrees for all signals in a wide frequency range. Therefore, it is difficult to obtain a power amplification device that can support a wide frequency range. Therefore, it is also difficult to obtain a transmission device and a communication device that have small power consumption and can be used in a wide frequency range.

The present invention has been devised in view of such problems, and an object thereof is to provide a power amplification device that can amplify an input signal having an envelope variation with high power-added efficiency in a wide frequency range, and to provide a transmission device and a communication device using the power amplification device.

Means for Solving the Problems

A power amplification device according to the present invention includes: a first orthogonal signal generating circuit for generating a first orthogonal signal by performing vector subtraction between a first fundamental signal and a second fundamental signal having the same amplitude and a phase difference δθ (0 degrees<δθ<180 degrees) therebetween, the first fundamental signal and the second fundamental signal being generated based on an input signal having an envelope variation; a second orthogonal signal generating circuit for generating a second orthogonal signal by performing vector addition between the first fundamental signal and the second fundamental signal; a variable gain amplifier circuit for amplifying the first orthogonal signal to generate a first constant envelope vector generation signal and a second constant envelope vector generation signal having phases opposite to each other; a first adder circuit comprising a first terminal to which the second orthogonal signal is input and a second terminal to which the first constant envelope vector generation signal is input, for performing vector addition between signals input from the first terminal and the second terminal to generate a first constant envelope signal; a second adder circuit comprising a third terminal to which the second orthogonal signal is input and a fourth terminal to which the second constant envelope vector generation signal is input, for performing vector addition between signals input from the third terminal and the fourth terminal to generate a second constant envelope signal; an amplitude control circuit for generating, based on an amplitude of the first constant envelope signal and an amplitude of the second constant envelope signal, an amplitude control signal for controlling a gain in the variable gain amplifier circuit; a first amplifier circuit for amplifying the first constant envelope signal to generate a first amplified signal; a second amplifier circuit for amplifying the second constant envelope signal to generate a second amplified signal; and an output adder circuit for performing vector addition between the first amplified signal and the second amplified signal to generate an amplified output signal having an envelope variation.

Further, in one aspect of the power amplification device of the present invention, the power amplification device may further include a phase shift circuit for changing a phase of the input signal to generate the first fundamental signal and the second fundamental signal.

Further, in one aspect of the power amplification device of the present invention, the input signal may be input to the first terminal of the first adder circuit and the third terminal of the second adder circuit. The first constant envelope signal and the second constant envelope signal may be input to the first orthogonal signal generating circuit as the first fundamental signal and the second fundamental signal. The first orthogonal signal generating circuit may perform vector subtraction between the first constant envelope signal and the second constant envelope signal to generate the first orthogonal signal. The first constant envelope signal and the second constant envelope signal may be input to the second orthogonal signal generating circuit as the first fundamental signal and the second fundamental signal. The second orthogonal signal generating circuit may perform vector addition between the first constant envelope signal and the second constant envelope signal to generate the second orthogonal signal. The first orthogonal signal may be input to the variable gain amplifier circuit. The second orthogonal signal may be input to the first terminal of the first adder circuit and the third terminal of the second adder circuit together with the input signal.

Further, in one aspect of the power amplification device of the present invention, the power amplification device may further include: a first amplitude detection circuit for generating a first amplitude detection signal corresponding to the amplitude of the first constant envelope signal; and a second amplitude detection circuit for generating a second amplitude detection signal corresponding to the amplitude of the second constant envelope signal. The amplitude control circuit may generate, based on the first amplitude detection signal and the second amplitude detection signal, the amplitude control signal for controlling the gain in the variable gain amplifier circuit.

Further, in one aspect of the power amplification device of the present invention, the power amplification device may further include a gain control circuit for generating, based on the amplitude of the first constant envelope signal and the amplitude of the second constant envelope signal, a first gain control signal for controlling a gain of the first adder circuit and a second gain control signal for controlling a gain of the second adder circuit.

Further, in one aspect of the power amplification device of the present invention, the power amplification device may further include: a first amplitude detection circuit for generating a first amplitude detection signal corresponding to the amplitude of the first constant envelope signal; and a second amplitude detection circuit for generating a second amplitude detection signal corresponding to the amplitude of the second constant envelope signal. A voltage of the first amplitude detection signal may have a value corresponding to the amplitude of the first constant envelope signal. A voltage of the second amplitude detection signal may have a value corresponding to the amplitude of the second constant envelope signal. A voltage of the first gain control signal may have a value obtained by subtracting the voltage of the first amplitude detection signal from a predetermined reference voltage. A voltage of the second gain control signal may have a value obtained by subtracting the voltage of the second amplitude detection signal from the predetermined reference voltage.

In addition, a power amplification device according to the present invention includes: a phase shift circuit for changing a phase of an input signal having an envelope variation to generate a first fundamental signal and a second fundamental signal having the same amplitude and a phase difference δθ (0 degrees<δθ<180 degrees) therebetween; a first orthogonal signal generating circuit for generating a first orthogonal signal by performing vector subtraction between the first fundamental signal and the second fundamental signal input thereto; a second orthogonal signal generating circuit for generating a second orthogonal signal by performing vector addition between the first fundamental signal and the second fundamental signal input thereto; a variable gain amplifier circuit for amplifying the first orthogonal signal input thereto to generate a first constant envelope vector generation signal and a second constant envelope vector generation signal having phases opposite to each other; a first adder circuit for performing vector addition between the second orthogonal signal and the first constant envelope vector generation signal input thereto to generate a first constant envelope signal; a second adder circuit for performing vector addition between the second orthogonal signal and the second constant envelope vector generation signal input thereto to generate a second constant envelope signal; a first amplitude detection circuit for detecting an amplitude of the first constant envelope signal input thereto to generate a first amplitude detection signal; a second amplitude detection circuit for detecting an amplitude of the second constant envelope signal input thereto to generate a second amplitude detection signal; an amplitude control circuit for generating, based on the first amplitude detection signal and the second amplitude detection signal input thereto, an amplitude control signal for controlling a gain in the variable gain amplifier circuit; a first amplifier circuit for amplifying the first constant envelope signal input thereto to generate a first amplified signal; a second amplifier circuit for amplifying the second constant envelope signal input thereto to generate a second amplified signal; and an output adder circuit for performing vector addition between the first amplified signal and the second amplified signal input thereto to generate an amplified output signal having an envelope variation.

In addition, a power amplification device according to the present invention includes: a variable gain amplifier circuit for amplifying a fundamental signal input thereto to generate a first constant envelope vector generation signal and a second constant envelope vector generation signal having phases opposite to each other; a first adder circuit comprising a first terminal to which an input signal having an envelope variation is input and a second terminal to which the first constant envelope vector generation signal is input, for performing vector addition between signals input from the first terminal and the second terminal to generate a first constant envelope signal; a second adder circuit comprising a third terminal to which the input signal is input and a fourth terminal to which the second constant envelope vector generation signal is input, for performing vector addition between signals input from the third terminal and the fourth terminal to generate a second constant envelope signal; a first amplitude detection circuit for detecting an amplitude of the first constant envelope signal input thereto to generate a first amplitude detection signal; a second amplitude detection circuit for detecting an amplitude of the second constant envelope signal input thereto to generate a second amplitude detection signal; an amplitude control circuit for generating, based on the first amplitude detection signal and the second amplitude detection signal input thereto, an amplitude control signal for controlling a gain in the variable gain amplifier circuit; a first amplifier circuit for amplifying the first constant envelope signal input thereto to generate a first amplified signal; a second amplifier circuit for amplifying the second constant envelope signal input thereto to generate a second amplified signal; an output adder circuit for performing vector addition between the first amplified signal and the second amplified signal input thereto to generate an amplified output signal having an envelope variation; a first orthogonal signal generating circuit for generating a first orthogonal signal by performing vector subtraction between the first constant envelope signal and the second constant envelope signal input thereto; and a second orthogonal signal generating circuit for generating a second orthogonal signal by performing vector addition between the first constant envelope signal and the second constant envelope signal input thereto, in which the first orthogonal signal is input to the variable gain amplifier circuit as the fundamental signal, and the second orthogonal signal is input to the first terminal of the first adder circuit and the third terminal of the second adder circuit together with the input signal.

In addition, in one aspect of the power amplification device of the present invention, the power amplification device may further include a gain control circuit for generating, based on the first amplitude detection signal and the second amplitude detection signal input thereto, a first gain control signal for controlling a gain of the first adder circuit and a second gain control signal for controlling a gain of the second adder circuit.

Further, in one aspect of the power amplification device of the present invention, a voltage of the first amplitude detection signal may be a value corresponding to the amplitude of the first constant envelope signal. A voltage of the second amplitude detection signal may be a value corresponding to the amplitude of the second constant envelope signal. A voltage of the first gain control signal may be a value obtained by subtracting the voltage of the first amplitude detection signal from a predetermined reference voltage. A voltage of the second gain control signal may be a value obtained by subtracting the voltage of the second amplitude detection signal from the predetermined reference voltage.

In a transmission device according to the present invention, a transmission circuit is connected to an antenna via any one of the above-mentioned power amplification devices of the present invention.

In a communication device according to the present invention, a transmission circuit and a receiving circuit are connected to an antenna, and any one of the above-mentioned power amplification devices of the present invention is inserted between the transmission circuit and the antenna.

Effect of the Invention

The power amplification device of the present invention includes: a first orthogonal signal generating circuit for generating a first orthogonal signal from a first fundamental signal and a second fundamental signal generated based on an input signal having an envelope variation; a second orthogonal signal generating circuit for generating a second orthogonal signal from the first fundamental signal and the second fundamental signal; a variable gain amplifier circuit for generating a first constant envelope vector generation signal and a second constant envelope vector generation signal from the first orthogonal signal; a first adder circuit for generating a first constant envelope signal from the second orthogonal signal and the first constant envelope vector generation signal; a second adder circuit for generating a second constant envelope signal from the second orthogonal signal and the second constant envelope vector generation signal; an amplitude control circuit for controlling a gain in the variable gain amplifier circuit based on an amplitude of the first constant envelope signal and an amplitude of the second constant envelope signal; a first amplifier circuit for amplifying the first constant envelope signal to generate a first amplified signal; a second amplifier circuit for amplifying the second constant envelope signal to generate a second amplified signal; and an output adder circuit for performing vector addition between the first amplified signal and the second amplified signal to generate an amplified output signal having an envelope variation. Therefore, according to the power amplification device of the present invention, the input signal having the envelope variation is converted into two constant envelope signals. The two constant envelope signals are amplified and then vector addition between the two constant envelope signals is performed. As a result, it is possible to obtain an amplified output signal having the envelope variation. Therefore, it is possible to amplify a signal having an envelope variation with high power-added efficiency.

In addition, the power amplification device of the present invention includes: a first orthogonal signal generating circuit for generating a first orthogonal signal by performing vector subtraction between a first fundamental signal and a second fundamental signal having the same amplitude and a phase difference $\delta\theta$ (0 degrees<$\delta\theta$<180 degrees) therebetween, the first fundamental signal and the second fundamental signal being generated based on an input signal having an envelope variation; a second orthogonal signal generating circuit for generating a second orthogonal signal by performing vector addition between the first fundamental signal and the second fundamental signal; a variable gain amplifier circuit for amplifying the first orthogonal signal to generate a first constant envelope vector generation signal and a second constant envelope vector generation signal having phases opposite to each other; a first adder circuit for performing vector addition between the second orthogonal signal and the first constant envelope vector generation signal to generate a first constant envelope signal; and a second adder circuit for performing vector addition between the second orthogonal signal and the second constant envelope vector generation signal to generate a second constant envelope signal. Therefore, according to the power amplification device of the present invention, it is possible to obtain the first constant envelope signal and the second constant envelope signal by using the first orthogonal signal and the second orthogonal signal that are orthogonal to each other, without using a 90-degree phase shifter. As a result, the power amplification device can be used in a wide frequency range.

Further, in one aspect of the power amplification device of the present invention, the power amplification device further includes a gain control circuit for generating, based on the amplitude of the first constant envelope signal and the amplitude of the second constant envelope signal, a first gain control signal for controlling a gain of the first adder circuit and a second gain control signal for controlling a gain of the second adder circuit. With this structure, it is possible to control the gain of the first adder circuit and the gain of the second adder circuit based on the amplitude of the first constant envelope signal and the amplitude of the second constant envelope signal. As a result, even in a case where there is a difference between performance of the first adder circuit and performance of the second adder circuit, it is possible to adjust the gain of the first adder circuit and the gain of the second adder circuit so that the amplitude of the first constant envelope signal and the amplitude of the second constant envelope signal can be matched with each other.

In addition, in one aspect of the power amplification device of the present invention, a first amplitude detection signal corresponding to the amplitude of the first constant envelope signal and a second amplitude detection signal corresponding to the amplitude of the second constant envelope signal are generated. In addition, a voltage of the first amplitude detection signal has a value corresponding to the amplitude of the first constant envelope signal, a voltage of the second amplitude detection signal has a value corresponding to the amplitude of the second constant envelope signal. A voltage of the first gain control signal has a value obtained by subtracting the voltage of the first amplitude detection signal from a predetermined reference voltage, and a voltage of the second gain control signal has a value obtained by subtracting the voltage of the second amplitude detection signal from a predetermined reference voltage. With this structure, the amplitude of the first constant envelope signal and the amplitude of the second constant envelope signal can be matched with each other by using a simple circuit. For instance, if the voltage of the first amplitude detection signal and the voltage of the second amplitude detection signal when the amplitude of the first constant envelope signal and the amplitude of the second constant envelope signal have a desired value are set to a reference voltage, the voltage of the first gain control signal and the voltage of the second gain control signal each have an opposite polarity with respect to a deviation of each of the amplitude of the first constant envelope signal and the amplitude of the second constant envelope signal from the desired value. Specifically, the polarity is negative if the amplitude of the first constant envelope signal and the amplitude of the second constant envelope signal are larger than a desired value, while the polarity is positive if the amplitude of the first constant envelope signal and the amplitude of the second constant envelope signal are smaller than the desired value. Further, the amplitude of the first constant envelope signal can be matched with a desired amplitude by controlling the gain of the first adder circuit so as to change the amplitude of the first constant envelope signal, using the first gain control signal having the voltage of the opposite polarity with respect to a deviation of the amplitude of the first constant envelope signal from the desired value. Similarly, the amplitude of the second constant envelope signal can be matched with the desired amplitude by controlling the gain of the second adder circuit so as to change the amplitude of the second constant envelope signal, using the second gain control signal having the voltage of the opposite polarity with respect to the deviation of the amplitude of the second constant envelope signal from the desired value. Thus, both the amplitude of the first constant envelope signal and the amplitude of the second constant envelope signal are the same as the desired amplitude. Therefore, the amplitude of the first constant envelope signal and the amplitude of the second constant envelope signal can be matched with each other.

According to the transmission device of the present invention, the transmission circuit is connected to the antenna via the power amplification device described above. Therefore, it is possible to amplify a transmission signal having an envelope variation from the transmission circuit by using the power amplification device of the present invention having low power consumption and high power-added efficiency. As a result, it is possible to obtain a transmission device having low power consumption and long transmission time.

According to the communication device of the present invention, the transmission circuit and the receiving circuit are connected to the antenna, and the power amplification device described above is inserted between the transmission circuit and the antenna. Therefore, it is possible to amplify a transmission signal having an envelope variation from the transmission circuit by using the power amplification device of the present invention having low power consumption and high power-added efficiency. As a result, it is possible to obtain a communication device having low power consumption and long transmission time.

BEST MODE FOR CARRYING OUT THE INVENTION

Hereinafter, a power amplification device according to an embodiment of the present invention, and a transmission device and a communication device using the power amplification device according to the embodiment of the present invention are described in detail with reference to the attached drawings.

First Example of the Embodiment

Figure 1:
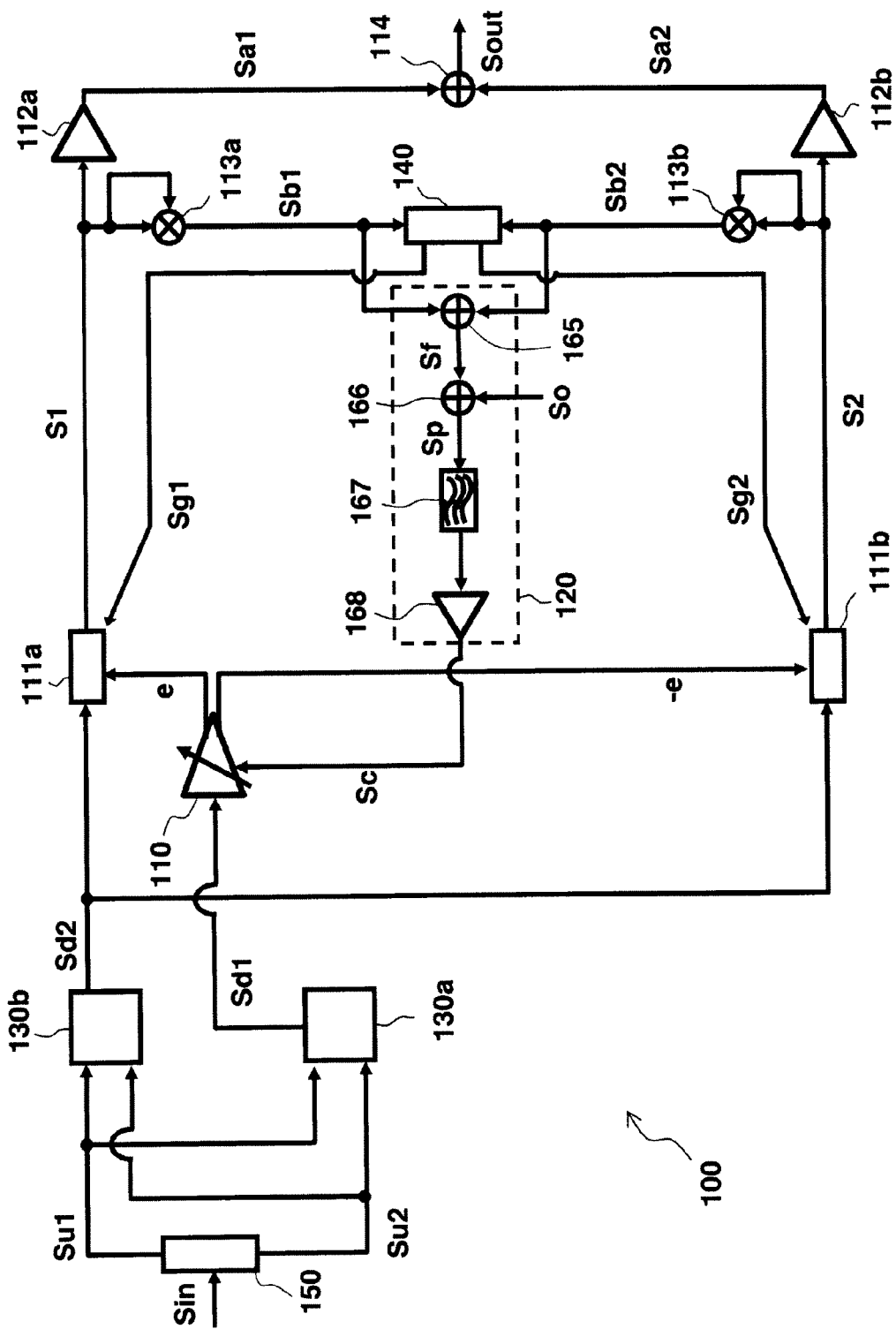
FIG. 1 is a block diagram illustrating schematically an example of a power amplification device according to an embodiment of the present invention.

FIG. 1 is a block diagram illustrating schematically an example of the power amplification device according to the embodiment of the present invention.

In a power amplification device 100 according to this embodiment, an input signal Sin having an envelope variation is input to a phase shift circuit 150 as illustrated in FIG. 1. Then, the phase shift circuit 150 outputs a first fundamental signal Su1 and a second fundamental signal Su2, which have the same amplitude and a phase difference δθ therebetween (0 degrees<δθ<180 degrees).

Figure 2:
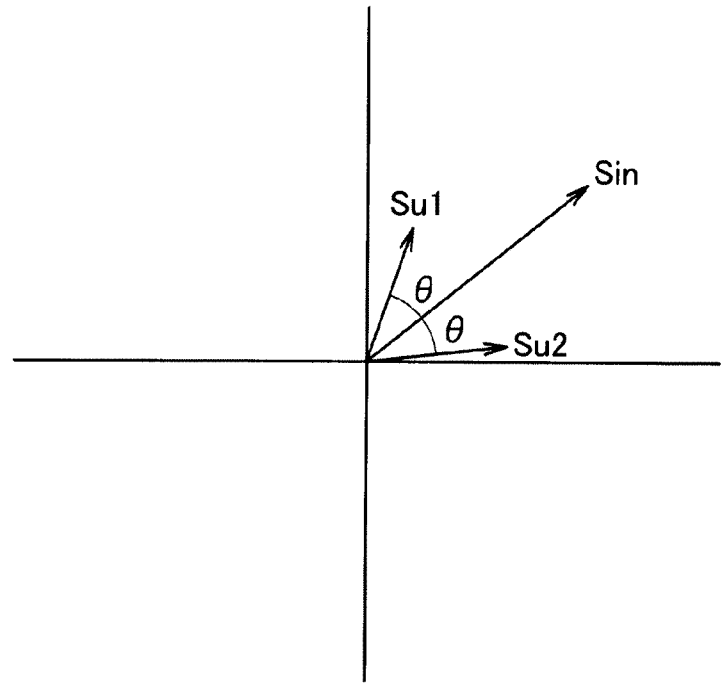
FIG. 2 is a diagram illustrating an example of a behavior of a phase shift circuit.

The phase shift circuit 150 generates the first fundamental signal Su1 and the second fundamental signal Su2 by changing a phase of the input signal Sin. FIG. 2 illustrates an example of a behavior of the phase shift circuit 150. For instance, the phase shift circuit 150 splits the input signal Sin into two signals having the same phase as that of the input signal Sin and the same amplitude as each other. Then, the first fundamental signal Su1, which is obtained by delaying a phase of one signal by θ (0 degrees<θ<90 degrees), is generated, and the second fundamental signal Su2, which is obtained by advancing a phase of the other signal by θ (0 degrees<θ<90 degrees), is generated.

Figure 3:
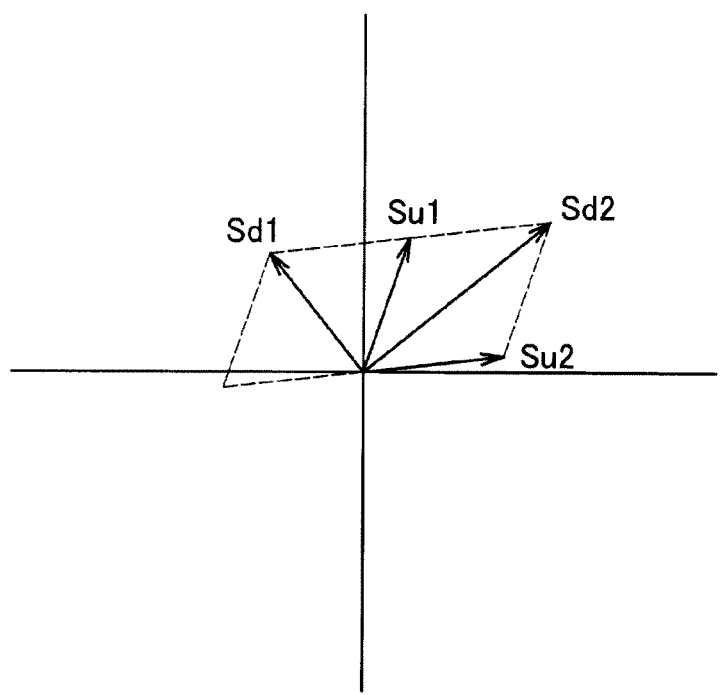
FIG. 3 is a diagram illustrating an example of a behavior of a first orthogonal signal generating circuit and a second orthogonal signal generating circuit.

The first fundamental signal Su1 and the second fundamental signal Su2 are input to both of a first orthogonal signal generating circuit 130a and a second orthogonal signal generating circuit 130b. FIG. 3 is a diagram illustrating an example of a behavior of the first orthogonal signal generating circuit 130a and the second orthogonal signal generating circuit 130b. As illustrated in FIG. 3, the first orthogonal signal generating circuit 130a performs vector subtraction between the first fundamental signal Su1 and the second fundamental signal Su2 input thereto, so as to generate and output a first orthogonal signal Sd1. The second orthogonal signal generating circuit 130b performs vector addition between the first fundamental signal Su1 and the second fundamental signal Su2 input thereto, so as to generate and output a second orthogonal signal Sd2.

Note that, in this embodiment, a phase of the second orthogonal signal Sd2 is matched with a phase of the input signal Sin. In other words, in this embodiment, the first fundamental signal Su1 and the second fundamental signal Su2 are generated so that the phase of the signal (second orthogonal signal Sd2) obtained by the vector addition between the first fundamental signal Su1 and the second fundamental signal Su2 is the same as the phase of the input signal Sin.

Here, the first fundamental signal Su1 and the second fundamental signal Su2 have the same amplitude and a phase difference δθ therebetween (0 degrees<δθ<180 degrees). Therefore, the phase of the first orthogonal signal Sd1 is different from the phase of the second orthogonal signal Sd2 by 90 degrees. In other words, the first orthogonal signal Sd1 and the second orthogonal signal Sd2 are orthogonal to each other. Note that, it is sufficient that the first fundamental signal Su1 and the second fundamental signal Su2 have the same amplitude and different phases. Even if the phase difference δθ between the first fundamental signal Su1 and the second fundamental signal Su2 varies, orthogonality between the first orthogonal signal Sd1 and the second orthogonal signal Sd2 is maintained. Therefore, the phase shift circuit 150 can be constituted easily by using a distributed constant line or an LC circuit that can branch a signal.

Figure 4:
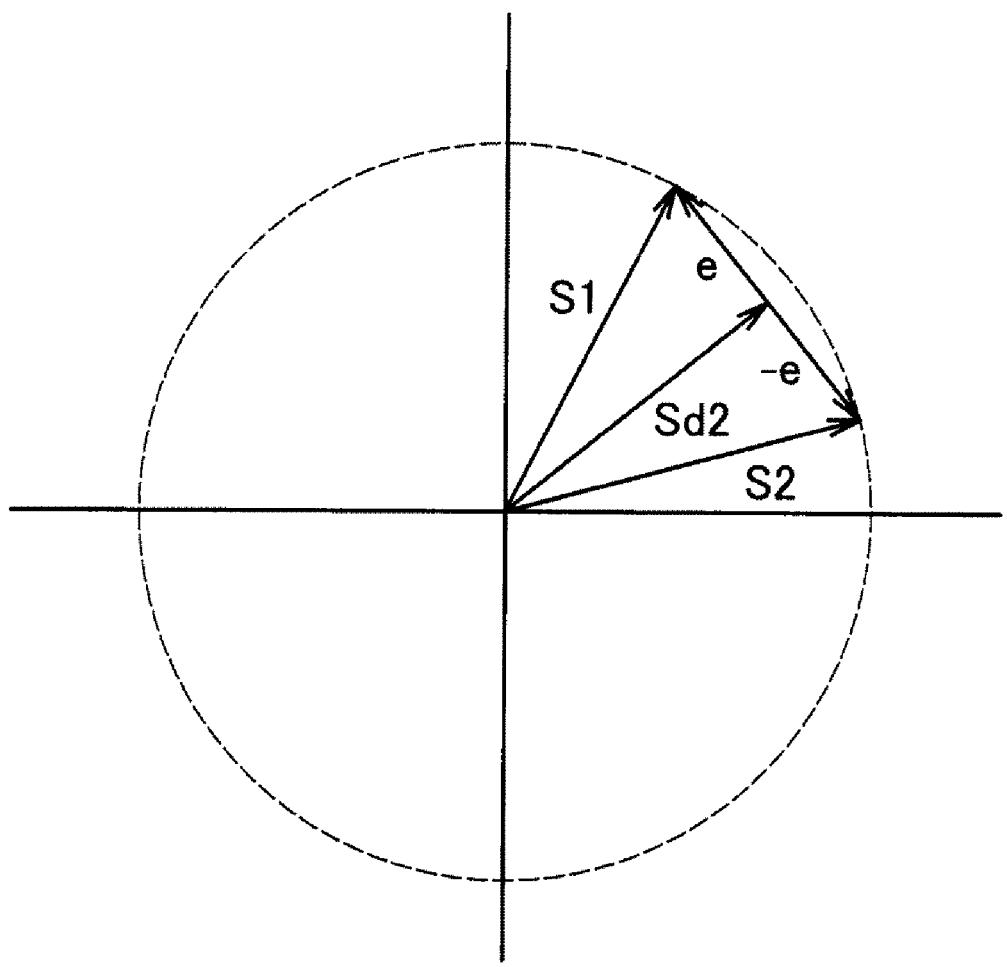
FIG. 4 is a diagram illustrating an example of a behavior of a variable gain amplifier circuit, a first adder circuit, and a second adder circuit.

The second orthogonal signal Sd2 has a predetermined phase relationship with the input signal Sin and has an amplitude increasing and decreasing along with an increase or a decrease of amplitude of the input signal Sin. The second orthogonal signal Sd2 is input to a first adder circuit 111a and a second adder circuit 111b. In other words, the second orthogonal signal Sd2 is input to a first terminal (not shown) of the first adder circuit 111a and a third terminal (not shown) of the second adder circuit 111b. In addition, the first orthogonal signal Sd1 is input to a variable gain amplifier circuit 110. FIG. 4 is a diagram illustrating an example of a behavior of the variable gain amplifier circuit 110, and the first adder circuit 111a and the second adder circuit 111b to be described later. The variable gain amplifier circuit 110 generates a first constant envelope vector generation signal e and a second constant envelope vector generation signal −e based on the first orthogonal signal Sd1. As illustrated in FIG. 4, the first constant envelope vector generation signal e and the second constant envelope vector generation signal −e are orthogonal to the second orthogonal signal Sd2. In addition, the first constant envelope vector generation signal e and the second constant envelope vector generation signal −e have the same amplitude and opposite phases. In other words, the first orthogonal signal Sd1 is amplified by the variable gain amplifier circuit 110 and then is output as the first constant envelope vector generation signal e and the second constant envelope vector generation signal −e that are orthogonal to the second orthogonal signal Sd2 and have the same amplitude and opposite phases. Then, the first constant envelope vector generation signal e and the second constant envelope vector generation signal −e are input to the first adder circuit 111a and the second adder circuit 111b, respectively. In other words, the first constant envelope vector generation signal e is input to a second terminal (not shown) of the first adder circuit 111a, and the second constant envelope vector generation signal −e is input to a fourth terminal (not shown) of the second adder circuit 111b.

Note that, For example, an image rejection double balanced mixer or the like can be used as the first orthogonal signal generating circuit 130a and the second orthogonal signal generating circuit 130b. In addition, it is preferred that the variable gain amplifier circuit 110 be constituted by using a variable gain amplifier that can support differential output. However, a variable gain amplifier and a phase shift circuit may be combined to constitute the variable gain amplifier circuit 110 in some cases.

The first adder circuit 111a performs vector addition between the signal input from the first terminal (not shown) and the signal input from the second terminal (not shown) so as to generate and output a first constant envelope signal S1. In other words, as illustrated in FIG. 4, the first adder circuit 111a performs vector addition between the second orthogonal signal Sd2 and the first constant envelope vector generation signal e so as to generate and output the first constant envelope signal S1. In addition, the second adder circuit 111b performs vector addition between the signal input from the third terminal (not shown) and the signal input from the fourth terminal (not shown) so as to generate and output a second constant envelope signal S2. In other words, as illustrated in FIG. 4, the second adder circuit 111b performs vector addition between the second orthogonal signal Sd2 and the second constant envelope vector generation signal −e so as to generate and output the second constant envelope signal S2.

The first constant envelope signal S1 is input to a first amplitude detection circuit 113a so that a first amplitude detection signal Sb1 corresponding to the amplitude of the first constant envelope signal S1 is generated by the first amplitude detection circuit 113a. For instance, the first amplitude detection signal Sb1 having a DC voltage signal indicating a square value of the amplitude of the first constant envelope signal S1 is generated. Similarly, the second constant envelope signal S2 is input to a second amplitude detection circuit 113b so that a second amplitude detection signal Sb2 corresponding to the amplitude of the second constant envelope signal S2 is generated by the second amplitude detection circuit 113b. For instance, the second amplitude detection signal Sb2 having a DC voltage signal indicating a square value of the amplitude of the second constant envelope signal S2 is generated. Note that, for example, Gilbert cell mixer can be used as the first amplitude detection circuit 113a and the second amplitude detection circuit 113b.

Then, the first amplitude detection signal Sb1 and the second amplitude detection signal Sb2 are input to an amplitude control circuit 120. The amplitude control circuit 120 is a circuit for generating an amplitude control signal Sc for controlling a gain of the variable gain amplifier circuit 110 based on amplitudes of the first constant envelope signal S1 and the second constant envelope signal S2. Specifically, the first amplitude detection signal Sb1 and the second amplitude detection signal Sb2 are input to an adder 165 and are added to each other by the adder 165. Then, the signal obtained by adding the first amplitude detection signal Sb1 and the second amplitude detection signal Sb2 is output from the adder 165 as an amplitude detection signal Sf. The amplitude detection signal Sf is input to an adder 166, and an amplitude control fundamental signal Sp having a voltage obtained by subtracting a voltage of the amplitude detection signal Sf from a voltage of a reference signal So is generated. A high frequency component of the amplitude control fundamental signal Sp is removed by a low pass filter 167, and then the amplitude control fundamental signal Sp is amplified by a buffer amplifier 168. After that, the amplitude control fundamental signal Sp is supplied to the variable gain amplifier circuit 110 as the amplitude control signal Sc. The amplitude control signal Sc has a role as a gain control signal for controlling a gain of the variable gain amplifier circuit 110. Note that, the adder 165, the adder 166, the low pass filter 167, and the buffer amplifier 168 constitute the amplitude control circuit 120.

According to the power amplification device 100 of this embodiment having the structure described above, voltages of the amplitude control fundamental signal Sp and the amplitude control signal Sc based on the amplitude control fundamental signal Sp increase or decrease inversely to an increase or a decrease of the amplitudes of the first constant envelope signal S1 and the second constant envelope signal S2. Therefore, it is possible to generate the first constant envelope vector generation signal e and the second constant envelope vector generation signal −e that increase or decrease inversely to an increase or a decrease of the amplitude of the input signal Sin, by controlling the gain of the variable gain amplifier circuit 110 utilizing the amplitude control signal Sc. Thus, it is possible to generate the first constant envelope signal S1 and the second constant envelope signal S2 as constant envelope signals.

Then, the first constant envelope signal S1 is input to a first amplifier circuit 112a. The first amplifier circuit 112a amplifies the first constant envelope signal S1 so as to generate and output a first amplified signal Sa1. Similarly, the second constant envelope signal S2 is input to a second amplifier circuit 112b. The second amplifier circuit 112b amplifies the second constant envelope signal S2 so as to generate and output a second amplified signal Sa2. The first amplified signal Sa1 and the second amplified signal Sa2 are input to an output adder circuit 114. The output adder circuit 114 performs vector addition between the first amplified signal Sa1 and the second amplified signal Sa2 so as to generate and output an output signal Sout having an envelope variation.

In this way, the power amplification device 100 according to this embodiment decomposes the input signal Sin having an envelope variation into the first constant envelope signal S1 and the second constant envelope signal S2 that are constant envelope signals. Then, by using the first amplifier circuit 112a and the second amplifier circuit 112b, the first constant envelope signal S1 and the second constant envelope signal S2 are amplified with high power-added efficiency, to thereby obtain the first amplified signal Sa1 and the second amplified signal Sa2. Further, after that, the output adder circuit 114 performs vector addition between the first amplified signal Sa1 and the second amplified signal Sa2, to thereby generate the output signal Sout having the envelope variation. Therefore, according to the power amplification device 100 of this embodiment, it is possible to amplify the signal having an envelope variation with high power-added efficiency.

In addition, according to the power amplification device 100 of this embodiment, it is possible to obtain the second orthogonal signal Sd2 having a predetermined phase relationship with the input signal Sin and the first orthogonal signal Sd1 that is orthogonal to the second orthogonal signal Sd2 by using the first orthogonal signal generating circuit 130a and the second orthogonal signal generating circuit 130b without using a 90-degree phase shifter. If the amplitude of the first fundamental signal Su1 is the same as the amplitude of the second fundamental signal Su2, the first orthogonal signal Sd1 is orthogonal to the second orthogonal signal Sd2 even if the frequency is not a particular frequency. Therefore, according to the power amplification device 100 of this embodiment, it is possible to obtain a power amplification device that can be used in a wide frequency range.

In addition, in the power amplification device 100 according to this embodiment, the first amplitude detection signal Sb1 output from the first amplitude detection circuit 113a and the second amplitude detection signal Sb2 output from the second amplitude detection circuit 113b are input to a gain control circuit 140. The gain control circuit 140 is a circuit for generating a first gain control signal Sg1 for controlling a gain of the first adder circuit 111a and a second gain control signal Sg2 for controlling a gain of the second adder circuit 111b based on amplitudes of the first constant envelope signal S1 and the second constant envelope signal S2.

In the gain control circuit 140, the first gain control signal Sg1 having a voltage obtained by subtracting a voltage of the first amplitude detection signal Sb1 from a reference voltage and the second gain control signal Sg2 having a voltage obtained by subtracting a voltage of the second amplitude detection signal Sb2 from a reference voltage are generated. The first gain control signal Sg1 is input to the first adder circuit 111a to control a gain of the first adder circuit 111a and thereby control an amplitude of the first constant envelope signal S1. The second gain control signal Sg2 is input to the second adder circuit 111b to control a gain of the second adder circuit 111b and thereby control an amplitude of the second constant envelope signal S2.

Note that, for example, an image rejection double balanced mixer or the like may be used as the first adder circuit 111a, the second adder circuit 111b, and the output adder circuit 114. For example, a comparator may be used as the gain control circuit 140. Then, for example, the first gain control signal Sg1 and the second gain control signal Sg2 are input to current source gate terminals of mixers constituting the first adder circuit 111a and the second adder circuit 111b, so as to control a current supplied from a constant current source. Thus, it is possible to control gains of the first adder circuit 111a and the second adder circuit 111b.

According to the power amplification device 100 of this embodiment having the structure described above, voltages of the first amplitude detection signal Sb1 and the second amplitude detection signal Sb2 in a case where amplitudes of the first constant envelope signal S1 and the second constant envelope signal S2 are a desired value are set as the reference voltage. Thus, voltages of the first gain control signal Sg1 and the second gain control signal Sg2 have an opposite polarity with respect to a deviation of amplitudes of the first constant envelope signal S1 and the second constant envelope signal S2 from the desired value. Specifically, the polarity is negative if the amplitudes of the first constant envelope signal S1 and the second constant envelope signal S2 are larger than the desired value, while the polarity is positive if the amplitudes of the first constant envelope signal S1 and the second constant envelope signal S2 are smaller than the desired value.

Then, the gain of the first adder circuit 111a is controlled using the first gain control signal Sg1 having a voltage of an opposite polarity with respect to a deviation of the amplitude of the first constant envelope signal S1 from the desired value, to thereby change the amplitude of the first constant envelope signal S1. As a result, the amplitude of the first constant envelope signal S1 can be matched with the desired amplitude. Similarly, the gain of the second adder circuit 111b is controlled using the second gain control signal Sg2 having a voltage of an opposite polarity with respect to a deviation of the amplitude of the second constant envelope signal S2 from the desired value, to thereby change the amplitude of the second constant envelope signal S2. As a result, the amplitude of the second constant envelope signal S2 can be matched with the desired amplitude. Thus, both the amplitudes of the first constant envelope signal S1 and the second constant envelope signal S2 are the same as the desired amplitude. Therefore, the amplitude of the first constant envelope signal S1 and the amplitude of the second constant envelope signal S2 can be matched with each other.

In this way, according to the power amplification device 100 of this embodiment, gains of the first adder circuit 111a and the second adder circuit 111b are controlled based on the amplitude of the first constant envelope signal S1 and the amplitude of the second constant envelope signal S2, as a result, the amplitude of the first constant envelope signal S1 and the amplitude of the second constant envelope signal S2 can be matched with each other. As a result, the amplitude of the first constant envelope signal S1 and the amplitude of the second constant envelope signal S2 can be matched with each other even if there is a performance difference between the first adder circuit 111a and the second adder circuit 111b.

Second Example of the Embodiment

Figure 5:
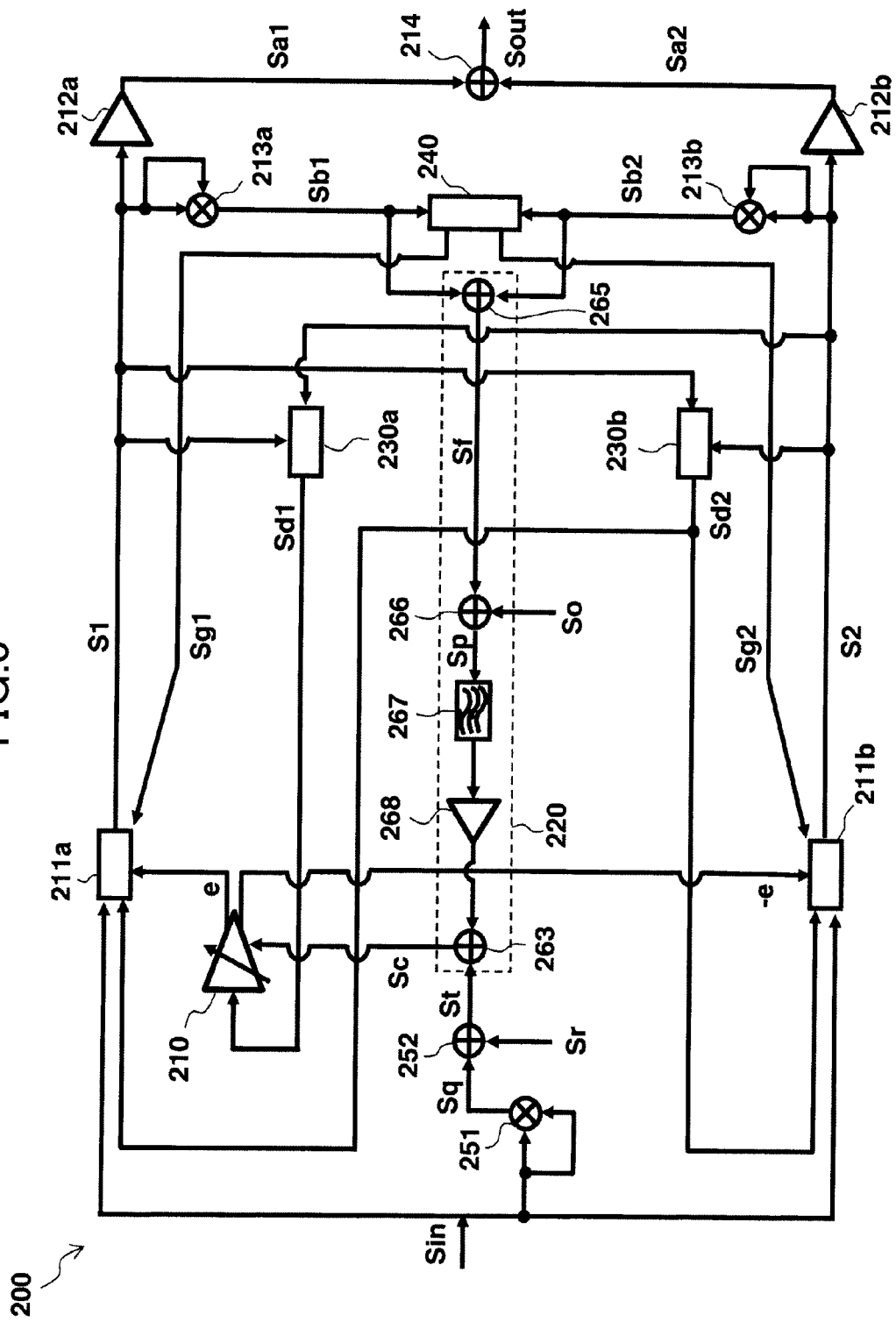
FIG. 5 is a block diagram illustrating schematically another example of the power amplification device according to the embodiment of the present invention.

FIG. 5 is a block diagram illustrating schematically another example of the power amplification device according to the embodiment of the present invention.

Figure 10:
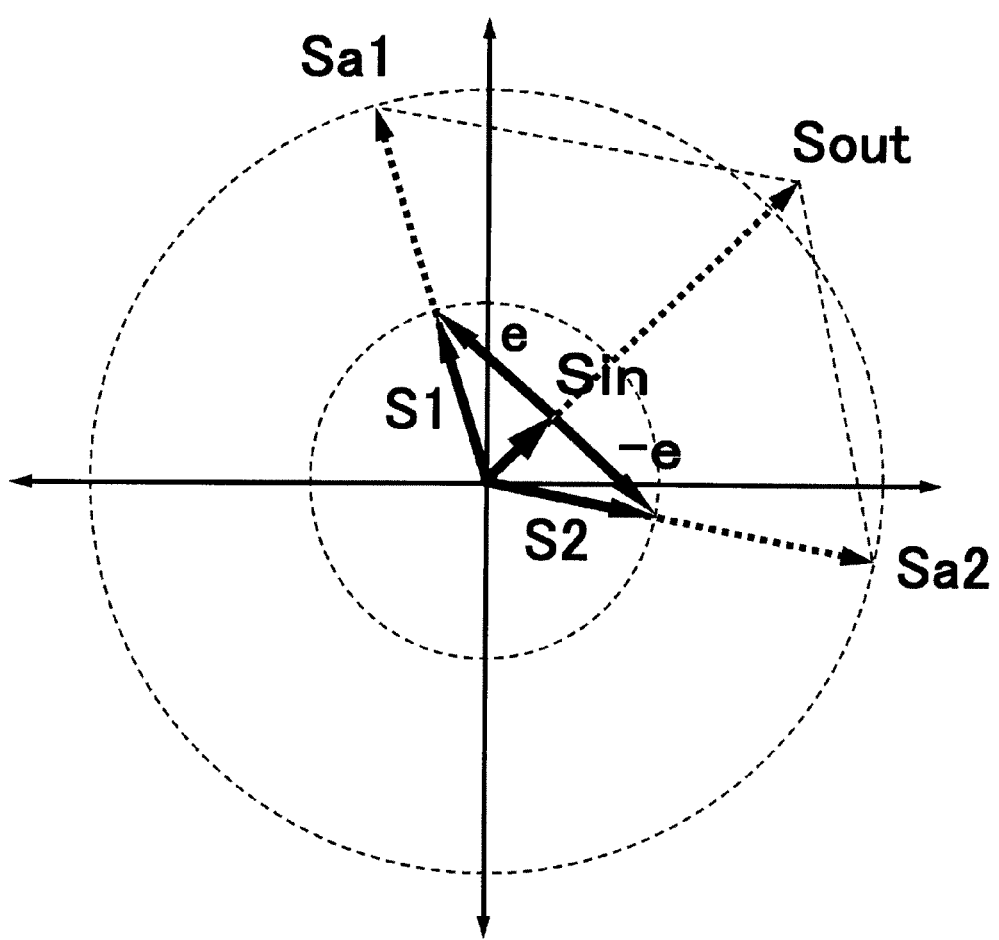
FIG. 10 is a vector diagram illustrating a fundamental principle of a signal conversion in the power amplification device that has been previously proposed by the applicant of this application.

In an power amplification device 200 according to this embodiment, as illustrated in FIG. 5, the input signal Sin having an envelope variation is input to a first terminal (not shown) of a first adder circuit 211a. The first adder circuit 211a performs vector addition between the input signal Sin and the first constant envelope vector generation signal e input to a second terminal (not shown) of the first adder circuit 211a and thereby generate the first constant envelope signal S1. The first constant envelope signal S1 is output from the first adder circuit 211a (see FIG. 10). In addition, the input signal Sin is input to a third terminal (not shown) of a second adder circuit 211b. The second adder circuit 211b performs vector addition between the input signal Sin and the second constant envelope vector generation signal −e input to a fourth terminal (not shown) of the second adder circuit 211b and thereby generate the second constant envelope signal S2. The second constant envelope signal S2 is output from the second adder circuit 211b (see FIG. 10). Note that, the first constant envelope vector generation signal e and the second constant envelope vector generation signal −e have the same amplitude and opposite phases.

Here, the first constant envelope signal S1 and the second constant envelope signal S2 have the same amplitude and a phase difference $\delta\theta$ therebetween (0 degrees<$\delta\theta$<180 degrees). The first constant envelope signal S1 has a phase that is delayed from the phase of the input signal Sin by a certain angle, and the second constant envelope signal S2 has a phase that is advanced from the phase of the input signal Sin by the same angle. A phase of the signal obtained by vector addition between the first constant envelope signal S1 and the second constant envelope signal S2 is the same as the phase of the input signal Sin.

Figure 6:
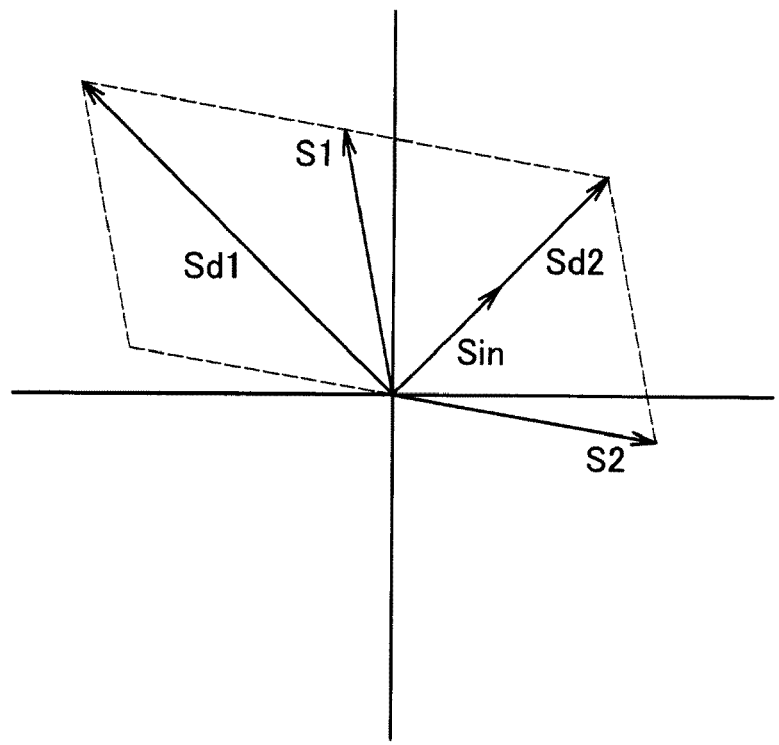
FIG. 6 is a diagram illustrating another example of the behavior of the first orthogonal signal generating circuit and the second orthogonal signal generating circuit.

The first constant envelope signal S1 (first fundamental signal) and the second constant envelope signal S2 (second fundamental signal) are input to a second orthogonal signal generating circuit 230b. The second orthogonal signal generating circuit 230b performs vector addition between the first constant envelope signal S1 and the second constant envelope signal S2, so as to generate and output the second orthogonal signal Sd2 (see FIG. 6). The second orthogonal signal Sd2 has the same phase as that of the input signal Sin, and is input together with the input signal Sin to the first terminal (not shown) of the first adder circuit 211a and the third terminal (not shown) of the second adder circuit 211b.

In addition, the first constant envelope signal S1 (first fundamental signal) and the second constant envelope signal S2 (second fundamental signal) are input to a first orthogonal signal generating circuit 230a. The first orthogonal signal generating circuit 230a performs vector subtraction between the first constant envelope signal S1 and the second constant envelope signal S2, so as to generate and output the first orthogonal signal Sd1 (see FIG. 6). Here, the amplitude of the first constant envelope signal S1 is the same as the amplitude of the second constant envelope signal S2, and hence the phase of each of the input signal Sin and the second orthogonal signal Sd2 is different from the phase of the first orthogonal signal Sd1 by 90 degrees (i.e., $\pi/2$). In other words, the input signal Sin and the second orthogonal signal Sd2 are orthogonal to the first orthogonal signal Sd1. The first orthogonal signal Sd1 is input to a variable gain amplifier circuit 210 as a fundamental signal and is amplified by the variable gain amplifier circuit 210, and then is output as the first constant envelope vector generation signal e and the second constant envelope vector generation signal −e that are orthogonal to the input signal Sin and the second orthogonal signal Sd2 and are opposite in phase to each other. Then, the first constant envelope vector generation signal e and the second constant envelope vector generation signal −e are input to the second terminal (not shown) of the first adder circuit 211a and the fourth terminal (not shown) of the second adder circuit 211b, respectively.

Note that, for example, an image rejection double balanced mixer or the like can be used as the first orthogonal signal generating circuit 230a and the second orthogonal signal generating circuit 230b. In addition, it is preferred to constitute the variable gain amplifier circuit 210 by using a variable gain amplifier that can support differential output, but a variable gain amplifier and a phase shift circuit may be combined to constitute the variable gain amplifier circuit 210 in some cases.

Further, the first constant envelope signal S1 is input to a first amplitude detection circuit 213a. The first amplitude detection circuit 213a generates the first amplitude detection signal Sb1 having a DC voltage signal indicating a square value of the amplitude of the first constant envelope signal S1. Similarly, the second constant envelope signal S2 is input to a second amplitude detection circuit 213b. The second amplitude detection circuit 213b generates the second amplitude detection signal Sb2 having a DC voltage signal indicating a square value of the amplitude of the second constant envelope signal S2. Note that, for example, a Gilbert cell mixer can be used as the first amplitude detection circuit 213a and the second amplitude detection circuit 213b.

Then, the first amplitude detection signal Sb1 and the second amplitude detection signal Sb2 are input to an amplitude control circuit 220. The amplitude control circuit 220 is a circuit for generating, based on the amplitudes of the first constant envelope signal S1 and the second constant envelope signal S2, an amplitude control signal Sc for controlling a gain of the variable gain amplifier circuit 210. Specifically, the first amplitude detection signal Sb1 and the second amplitude detection signal Sb2 are input to an adder 265 and are added to each other by the adder 265 so as to be output as an amplitude detection signal Sf. The amplitude detection signal Sf is input to an adder 266, so as to generate an amplitude control fundamental signal Sp having a voltage obtained by subtracting a voltage of the amplitude detection signal Sf from a voltage of the reference signal So. High frequency components of the amplitude control fundamental signal Sp are removed by a low pass filter 267, and the amplitude control fundamental signal Sp is amplified by a buffer amplifier 268. Then, the amplitude control fundamental signal Sp is supplied to the variable gain amplifier circuit 210 via an adder 263 as the amplitude control signal Sc. The amplitude control signal Sc has a role as a gain control signal for controlling a gain of the variable gain amplifier circuit 210. Note that, the adder 265, the adder 266, the low pass filter 267, the buffer amplifier 268, and the adder 263 constitute the amplitude control circuit 220.

According to the power amplification device 200 of this embodiment having the structure described above, voltages of the amplitude control fundamental signal Sp and the amplitude control signal Sc based on the amplitude control fundamental signal Sp increase or decrease inversely to an increase or a decrease of amplitudes of the first constant envelope signal S1 and the second constant envelope signal S2. Therefore, a gain of the variable gain amplifier circuit 210 is controlled using the amplitude control signal Sc, as a result, it is possible to generate the first constant envelope vector generation signal e and the second constant envelope vector generation signal −e that increase or decrease inversely to an increase or a decrease of amplitude of the input signal Sin. Thus, it is possible to generate the first constant envelope signal S1 and the second constant envelope signal S2 that are constant envelope signals.

Then, the first constant envelope signal S1 is input to a first amplifier circuit 212a. The first amplifier circuit 212a amplifies the first constant envelope signal S1 so as to generate and output the first amplified signal Sa1. Similarly, the second constant envelope signal S2 is input to a second amplifier circuit 212b. The second amplifier circuit 212b amplifies the second constant envelope signal S2 so as to generate and output the second amplified signal Sa2. The first amplified signal Sa1 and the second amplified signal Sa2 are input to an output adder circuit 214. The output adder circuit 214 performs vector addition between the first amplified signal Sa1 and the second amplified signal Sa2 so as to generate and output the output signal Sout having an envelope variation.

In this way, according to the power amplification device 200 of this embodiment, the input signal Sin having an envelope variation is decomposed into the first constant envelope signal S1 and the second constant envelope signal S2 that are constant envelope signals. Then, by using the first amplifier circuit 212a and the second amplifier circuit 212b, the first constant envelope signal S1 and the second constant envelope signal S2 are amplified with high power-added efficiency so as to obtain the first amplified signal Sa1 and the second amplified signal Sa2. After that, vector addition between the first amplified signal Sa1 and the second amplified signal Sa2 is performed by the output adder circuit 214 so as to generate the output signal Sout having the envelope variation. In other words, according to the power amplification device 200 of this embodiment, it is possible to amplify the signal having an envelope variation with a high power-added efficiency.

In addition, according to the power amplification device 200 of this embodiment, it is possible to obtain the second orthogonal signal Sd2, which has the same phase as that of the input signal Sin, and the first orthogonal signal Sd1, which is orthogonal to the input signal Sin and the second orthogonal signal Sd2, by using the first orthogonal signal generating circuit 230a and the second orthogonal signal generating circuit 230b without using a 90-degree phase shifter. The first orthogonal signal Sd1 and the second orthogonal signal Sd2 are orthogonal to each other even in the case where the frequency is not a particular frequency. Therefore, according to the power amplification device 200 of this embodiment, it is possible to obtain a power amplification device that can be used in a wide frequency range.

Note that, in the power amplification device 200 of this embodiment, the input signal Sin is input to an input amplitude detection circuit 251, and the input amplitude detection circuit 251 generates an input amplitude detection signal Sq having a DC voltage signal indicating a square value of the amplitude of the input signal Sin. The input amplitude detection signal Sq is input to an adder 252, and an amplitude control assist signal St having a voltage obtained by subtracting a voltage of the input amplitude detection signal Sq from a voltage of a second reference signal Sr is generated. The amplitude control assist signal St is input to the adder 263 and is added to the amplitude control fundamental signal Sp. According to the power amplification device 200 of this embodiment having the structure described above, the amplitude control assist signal St that increases or decreases inversely to an increase or a decrease of amplitude of the input signal Sin can be added to the amplitude control fundamental signal Sp. Therefore, even in the case where the amplitude of the input signal Sin is very small, insufficient voltage of the amplitude control signal Sc can be prevented. Note that, for example, a Gilbert cell mixer can be used as the input amplitude detection circuit 251.

In addition, in the power amplification device 200 of this embodiment, the first amplitude detection signal Sb1 output from the first amplitude detection circuit 213a and the second amplitude detection signal Sb2 output from the second amplitude detection circuit 213b are input to a gain control circuit 240. The gain control circuit 240 is a circuit for generating, based on amplitudes of the first constant envelope signal S1 and the second constant envelope signal S2, the first gain control signal Sg1 for controlling a gain of the first adder circuit 211a and the second gain control signal Sg2 for controlling a gain of the second adder circuit 211b.

In the gain control circuit 240, the first gain control signal Sg1 having a voltage obtained by subtracting a voltage of the first amplitude detection signal Sb1 from a reference voltage and the second gain control signal Sg2 having a voltage obtained by subtracting a voltage of the second amplitude detection signal Sb2 from the reference voltage are generated. The first gain control signal Sg1 is input to the first adder circuit 211a to control a gain of the first adder circuit 211a and thereby control the amplitude of the first constant envelope signal S1. The second gain control signal Sg2 is input to the second adder circuit 211b to control a gain of the second adder circuit 211b and thereby control the amplitude of the second constant envelope signal S2.

Note that, for example, an image rejection double balanced mixer or the like may be used as the first adder circuit 211a, the second adder circuit 211b, and the output adder circuit 214. For example, a comparator may be used as the gain control circuit 240. Then, for example, the first gain control signal Sg1 and the second gain control signal Sg2 are input to current source gate terminals of mixers constituting the first adder circuit 211a and the second adder circuit 211b, so as to control a current supplied from a constant current source. As a result, it is possible to control gains of the first adder circuit 211a and the second adder circuit 211b.

According to the power amplification device 200 of this embodiment having the structure described above, a voltage of the first amplitude detection signal Sb1 and the second amplitude detection signal Sb2 when the amplitudes of the first constant envelope signal S1 and the second constant envelope signal S2 are a desired value is set as the reference voltage. As a result, voltages of the first gain control signal Sg1 and the second gain control signal Sg2 have an opposite polarity with respect to a deviation of the amplitudes of the first constant envelope signal S1 and the second constant envelope signal S2 from the desired value. Specifically, the polarity is negative if the amplitudes of the first constant envelope signal S1 and the second constant envelope signal S2 are larger than the desired value, while the polarity is positive if the amplitudes of the first constant envelope signal S1 and the second constant envelope signal S2 are smaller than the desired value. Then, the gain of the first adder circuit 211a is controlled using the first gain control signal Sg1 having a voltage of an opposite polarity with respect to a deviation of the amplitude of the first constant envelope signal S1 from the desired value so as to change the amplitude of the first constant envelope signal S1. As a result, the amplitude of the first constant envelope signal S1 can be matched with a desired amplitude. Similarly, the gain of the second adder circuit 211b is controlled using the second gain control signal Sg2 having a voltage of an opposite polarity with respect to a deviation of the amplitude of the second constant envelope signal S2 from the desired value so as to change the amplitude of the second constant envelope signal S2. As a result, the amplitude of the second constant envelope signal S2 can be matched with the desired amplitude. Thus, both the amplitudes of the first constant envelope signal S1 and the second constant envelope signal S2 are the same as the desired amplitude. Therefore, the amplitude of the first constant envelope signal S1 and the amplitude of the second constant envelope signal S2 can be matched with each other.

In this way, according to the power amplification device 200 of this embodiment, the gains of the first adder circuit 211a and the second adder circuit 211b are controlled based on the amplitude of the first constant envelope signal S1 and the amplitude of the second constant envelope signal S2, as a result, the amplitude of the first constant envelope signal S1 and the amplitude of the second constant envelope signal S2 can be matched with each other. Therefore, the amplitude of the first constant envelope signal S1 and the amplitude of the second constant envelope signal S2 can be matched with each other even in the case where there is a performance difference between the first adder circuit 211a and the second adder circuit 211b. Thus, orthogonality between the second orthogonal signal Sd2 and each of the first orthogonal signal Sd1 and the input signal Sin can be guaranteed.

Third Example of the Embodiment

Figure 7:
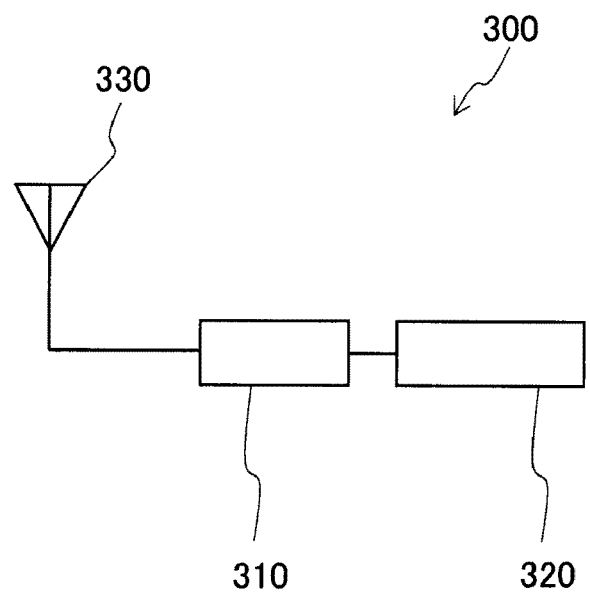
FIG. 7 is a block diagram illustrating schematically an example of a transmission device using the power amplification device according to the embodiment of the present invention.

FIG. 7 is a block diagram illustrating a structural example of a transmission device according to the embodiment of the present invention, which is a transmission device using the power amplification device according to the embodiment of the present invention.

In a transmission device 300 according to the embodiment of the present invention, as illustrated in FIG. 7, a transmission circuit 320 is connected to an antenna 330 via a power amplification device 310 according to the embodiment of the present invention. Here, the power amplification device 310 corresponds to the power amplification device 100 illustrated in FIG. 1, or the power amplification device 200 illustrated in FIG. 2, for example. According to the transmission device 300 of this embodiment having the structure described above, it is possible to amplify the transmission signal having an envelope variation output from the transmission circuit 320 by using the power amplification device 310 according to the embodiment of the present invention having low power consumption and high power-added efficiency. Therefore, it is possible to obtain a transmission device having low power consumption and long transmission time.

Fourth Example of the Embodiment

Figure 8:
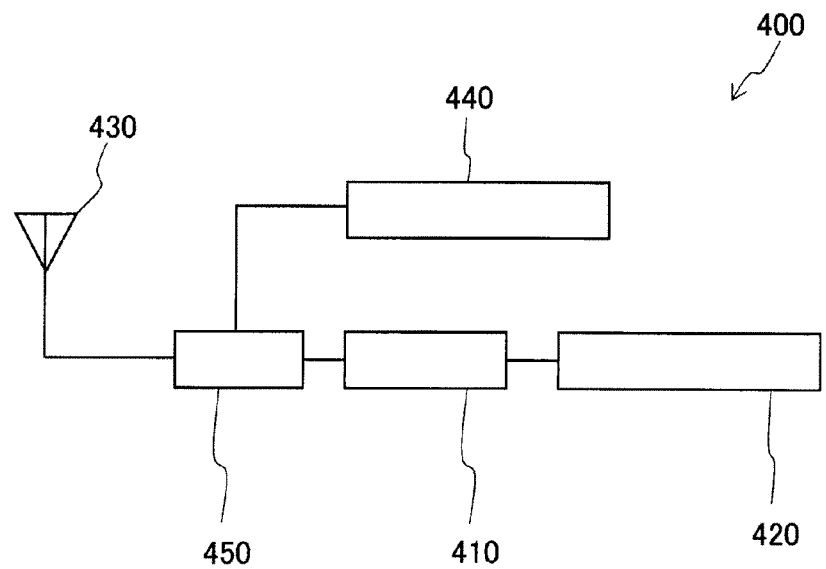
FIG. 8 is a block diagram illustrating schematically an example of a communication device using the power amplification device according to the embodiment of the present invention.
Figure 9:
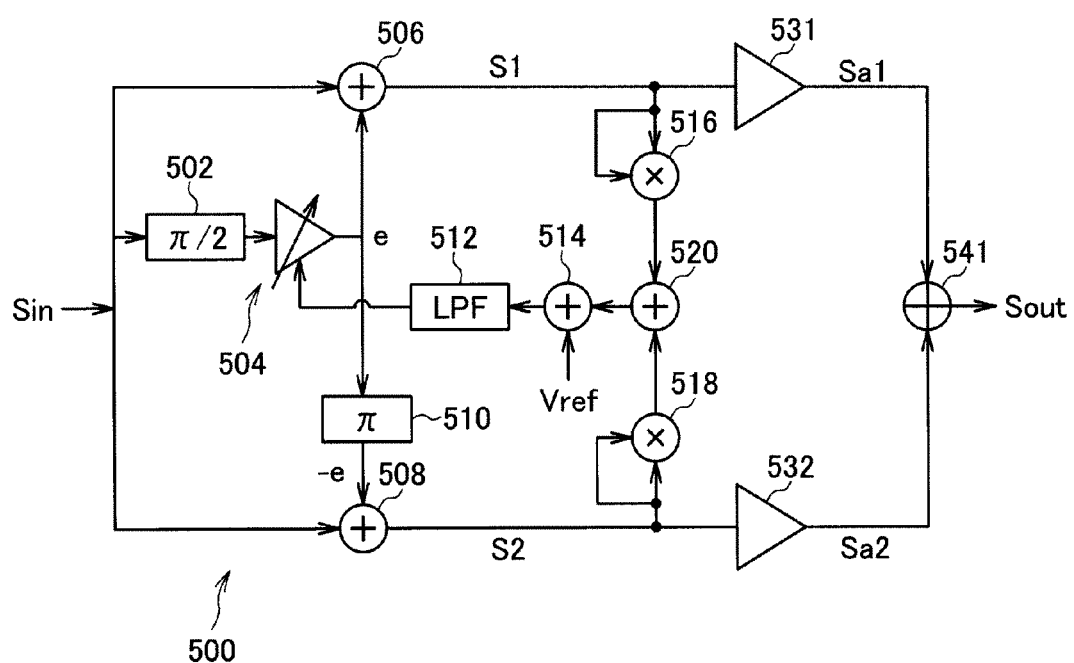
FIG. 9 is a block diagram illustrating schematically a power amplification device that has been previously proposed by the applicant of this application.

FIG. 8 is a block diagram illustrating a structural example of a communication device according to the embodiment of the present invention, which is a communication device using the power amplification device according to the embodiment of the present invention.

In a communication device 400 according to this embodiment, as illustrated in FIG. 8, a transmission circuit 420 and a receiving circuit 440 are connected to an antenna 430, and a power amplification device 410 according to the embodiment of the present invention is inserted between the transmission circuit 420 and the antenna 430. Here, the power amplification device 410 corresponds to the power amplification device 100 illustrated in FIG. 1, or the power amplification device 200 illustrated in FIG. 2, for example. In addition, an antenna sharing circuit 450 is inserted between the antenna 430 and each of the transmission circuit 420 and the receiving circuit 440. According to the communication device 400 of this embodiment having the structure described above, it is possible to amplify the transmission signal having an envelope variation output from the transmission circuit 420 by using the power amplification device 410 according to the embodiment of the present invention having small power consumption and high power-added efficiency. Therefore, it is possible to obtain a communication device having low power consumption and long transmission time.

Modified Example

The present invention is not limited to the examples of the embodiment described above, which can be modified or improved variously within the scope of the present invention without departing from the spirit thereof.

For instance, in the power amplification device 100 of the first example of the embodiment described above, the example is described in which gains of the first adder circuit 111*a* and the second adder circuit 111*b* are controlled by using the first gain control signal Sg1 having a voltage obtained by subtracting a voltage of the first amplitude detection signal Sb1 from the reference voltage and the second gain control signal Sg2 having a voltage obtained by subtracting a voltage of the second amplitude detection signal Sb2 from the reference voltage. In addition, for example, in the power amplification device 200 of the second example of the embodiment described above, the example is described in which gains of the first adder circuit 211*a* and the second adder circuit 211*b* are controlled by using the first gain control signal Sg1 having a voltage obtained by subtracting a voltage of the first amplitude detection signal Sb1 from the reference voltage and the second gain control signal Sg2 having a voltage obtained by subtracting a voltage of the second amplitude detection signal Sb2 from the reference voltage. However, for example, it is also possible to use the first gain control signal Sg1 having a voltage obtained by adding a reference voltage to the voltage of the first amplitude detection signal Sb1 and the second gain control signal Sg2 having a voltage obtained by adding the reference voltage to the voltage of the second amplitude detection signal Sb2. Alternatively, it is also possible to use a first gain control signal Sg1 having a current obtained by subtracting a current of the first amplitude detection signal Sb1 from a reference current and a second gain control signal Sg2 having a current obtained by subtracting a current of the second amplitude detection signal Sb2 from the reference current.

In addition, for example, in the power amplification device 200 of the second example of the embodiment described above, the example is described in which the amplitude control assist signal St is generated by using the input amplitude detection circuit 251 and the adder 252. However, in the case where a voltage of the amplitude control signal Sc can be sufficient, the input amplitude detection circuit 251 and the adder 252 are not necessary. In addition, the adder 263 is also not necessary. The signal output from the buffer amplifier 268 may be directly input to the variable gain amplifier circuit 210 as the amplitude control signal Sc.

The invention claimed is:

1. A power amplification device comprising:
   a first orthogonal signal generating circuit for generating a first orthogonal signal by performing vector subtraction between a first fundamental signal and a second fundamental signal having the same amplitude and a phase difference $\delta\theta$ (0 degrees<$\delta\theta$<180 degrees) therebetween, the first fundamental signal and the second fundamental signal being generated based on an input signal having an envelope variation;
   a second orthogonal signal generating circuit for generating a second orthogonal signal by performing vector addition between the first fundamental signal and the second fundamental signal;
   a variable gain amplifier circuit for amplifying the first orthogonal signal to generate a first constant envelope vector generation signal and a second constant envelope vector generation signal having phases opposite to each other;
   a first adder circuit comprising a first terminal to which the second orthogonal signal is input and a second terminal to which the first constant envelope vector generation signal is input, for performing vector addition between signals input from the first terminal and the second terminal to generate a first constant envelope signal;
   a second adder circuit comprising a third terminal to which the second orthogonal signal is input and a fourth terminal to which the second constant envelope vector generation signal is input, for performing vector addition between signals input from the third terminal and the fourth terminal to generate a second constant envelope signal;
   an amplitude control circuit for generating, based on an amplitude of the first constant envelope signal and an amplitude of the second constant envelope signal, an amplitude control signal for controlling a gain in the variable gain amplifier circuit;
   a first amplifier circuit for amplifying the first constant envelope signal to generate a first amplified signal;
   a second amplifier circuit for amplifying the second constant envelope signal to generate a second amplified signal; and
   an output adder circuit for performing vector addition between the first amplified signal and the second amplified signal to generate an amplified output signal having an envelope variation.

2. A power amplification device according to claim 1, further comprising a phase shift circuit for changing a phase of the input signal to generate the first fundamental signal and the second fundamental signal.

3. A power amplification device according to claim 1, wherein:
   the input signal is input to the first terminal of the first adder circuit and the third terminal of the second adder circuit;
   the first constant envelope signal and the second constant envelope signal are input to the first orthogonal signal generating circuit as the first fundamental signal and the second fundamental signal;
   the first orthogonal signal generating circuit performs vector subtraction between the first constant envelope signal and the second constant envelope signal to generate the first orthogonal signal;
   the first constant envelope signal and the second constant envelope signal are input to the second orthogonal signal generating circuit as the first fundamental signal and the second fundamental signal;
   the second orthogonal signal generating circuit performs vector addition between the first constant envelope signal and the second constant envelope signal to generate the second orthogonal signal;
   the first orthogonal signal is input to the variable gain amplifier circuit; and
   the second orthogonal signal is input to the first terminal of the first adder circuit and the third terminal of the second adder circuit together with the input signal.

4. A power amplification device according to claim 1, further comprising:
a first amplitude detection circuit for generating a first amplitude detection signal corresponding to the amplitude of the first constant envelope signal; and
a second amplitude detection circuit for generating a second amplitude detection signal corresponding to the amplitude of the second constant envelope signal,
wherein the amplitude control circuit generates, based on the first amplitude detection signal and the second amplitude detection signal, the amplitude control signal for controlling the gain in the variable gain amplifier circuit.

5. A power amplification device according to claim 1, further comprising a gain control circuit for generating, based on the amplitude of the first constant envelope signal and the amplitude of the second constant envelope signal, a first gain control signal for controlling a gain of the first adder circuit and a second gain control signal for controlling a gain of the second adder circuit.

6. A power amplification device according to claim 5, further comprising:
a first amplitude detection circuit for generating a first amplitude detection signal corresponding to the amplitude of the first constant envelope signal; and
a second amplitude detection circuit for generating a second amplitude detection signal corresponding to the amplitude of the second constant envelope signal, wherein:
a voltage of the first amplitude detection signal has a value corresponding to the amplitude of the first constant envelope signal;
a voltage of the second amplitude detection signal has a value corresponding to the amplitude of the second constant envelope signal;
a voltage of the first gain control signal has a value obtained by subtracting the voltage of the first amplitude detection signal from a predetermined reference voltage; and
a voltage of the second gain control signal has a value obtained by subtracting the voltage of the second amplitude detection signal from the predetermined reference voltage.

7. A transmission device, comprising:
the power amplification device according to claim 1;
an antenna; and
a transmission circuit connected to an antenna via the power amplification device.

8. A communication device, comprising:
an antenna;
a transmission circuit connected to the antenna;
a receiving circuit connected to the antenna; and
the power amplification device according to claim 1 inserted between the transmission circuit and the antenna.

* * * * *